United States Patent
Ray

(10) Patent No.: US 8,982,446 B2
(45) Date of Patent: Mar. 17, 2015

(54) REFLECTIVE COLOR DISPLAY

(71) Applicant: Nthdegree Technologies Worldwide Inc., Tempe, AZ (US)

(72) Inventor: William J. Ray, Fountain Hills, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/095,526

(22) Filed: Dec. 3, 2013

(65) Prior Publication Data

US 2014/0198373 A1    Jul. 17, 2014

Related U.S. Application Data

(60) Provisional application No. 61/753,709, filed on Jan. 17, 2013.

(51) Int. Cl.
*G02B 26/00* (2006.01)
*G02F 1/29* (2006.01)
(Continued)

(52) U.S. Cl.
CPC .............. *G02B 26/007* (2013.01); *H01L 33/60* (2013.01); *G02B 26/0858* (2013.01); *G02F 1/23* (2013.01); *G02F 1/29* (2013.01); *G02B 26/026* (2013.01); *H01L 33/50* (2013.01); *H01L 33/502* (2013.01)
USPC ............. 359/295; 359/296; 359/323; 345/84; 345/107; 345/204

(58) Field of Classification Search
CPC .... G02B 26/00; G02B 26/007; G02B 26/026; G02B 26/0858; G02F 1/00; G02F 1/0009; G02F 1/0018; G02F 1/23; G02F 1/29; H01L 33/50; H01L 33/501; H01L 33/502; H01L 33/60

USPC ......... 359/290, 291, 295, 296, 315, 318, 322, 359/323; 345/84–86, 107, 204; 349/12, 23; 257/89

See application file for complete search history.

(56) References Cited

U.S. PATENT DOCUMENTS 5,717,515 A * 2/1998 Sheridon ..................... 359/296
5,739,801 A * 4/1998 Sheridon ..................... 345/84
(Continued)

OTHER PUBLICATIONS

Arsenault et al. "Photonic-crystal full-colour displays" Nature Photonics, Aug. 2007, p. 468-472, vol. 1, Nautre Publishing Group.
(Continued)

*Primary Examiner* — Loha Ben
(74) *Attorney, Agent, or Firm* — Patent Law Group LLP; Brian D. Ogonowsky

(57) ABSTRACT

A reflective color display is disclosed. A substrate supports a first conductor layer and pixel wells. A piezoelectric segment is formed in each pixel well over the first conductor layer. A second conductor layer overlies the piezoelectric segments, wherein an electric field created across any piezoelectric segment causes the piezoelectric segment to expand or contract under control of the electric field. A Bragg reflector segment overlies each piezoelectric segment and is compressible by expansion of the underlying piezoelectric segment. A white light LED layer overlies the Bragg reflector segments. By varying the electric field across each piezoelectric segment, the overlying Bragg reflector segment is controlled to reflect a selected wavelength for each pixel of the display. The walls of the pixel wells provide acoustic isolation between adjacent pixel wells. An acoustic membrane isolates the Bragg reflector segment from high frequency vibrations of the piezoelectric segment.

25 Claims, 2 Drawing Sheets

(51) Int. Cl.
*H01L 33/60* (2010.01)
*G02B 26/08* (2006.01)
*G02F 1/23* (2006.01)
*G02B 26/02* (2006.01)
*H01L 33/50* (2010.01)

(56) References Cited

U.S. PATENT DOCUMENTS 5,760,761 A * 6/1998 Sheridon ............... 345/107
5,767,826 A * 6/1998 Sheridon et al. ............ 345/84
8,096,668 B2 * 1/2012 Abu-Ageel ............... 362/84
8,797,637 B2 * 8/2014 Fujishiro et al. ........... 359/296
2012/0164796 A1 6/2012 Lowenthal et al.

OTHER PUBLICATIONS

Arsenault et al. "A Polychromic, Fast Response Metallopolymer Gel Photonic Crystal with Solvent and Redox Tunability: A Step Towards Photonic Ink (P-Ink)" Advanced Materials, Mar. 17, 2003, p. 503-507, vol. 15, Wiley-Vch Verlag GmbH & Co. KGaA, Weinheim.

* cited by examiner

REFLECTIVE COLOR DISPLAY

CROSS-REFERENCE TO RELATED APPLICATIONS

This application claims priority from U.S. provisional application Ser. No. 61/753,709, by William J. Ray, assigned to the present assignee and incorporated herein by reference.

FIELD OF THE INVENTION

This invention relates to reflective color displays and, in particular, to a reflective color display employing a transparent LED layer for illuminating the display and piezoelectric elements to control the reflected color of each pixel.

BACKGROUND

Reflective color results from one of two primary mechanisms. One mechanism is the traditional subtractive mechanism where a chromophore molecule absorbs a particular wavelength of light and reflects the remaining light of a given color. This is the mechanism of pigments.

Addressable reflective chromophore type color can be seen in several electrophoretic display technologies, such as certain E-Ink and Liquavista products and a number of products that fall under the definition of transflective displays. Generally speaking, electrophoretic approaches cannot refresh at a rate sufficient for animated display and exhibit poor color saturation, while the transflective displays, while having high pixel refresh rates, yield a poor color image quality and are significantly more expensive than a standard liquid crystal display (LCD).

Another group of color mechanisms fall under the general term of "structural" color. Bragg reflectors, diffraction gratings, and other similar mechanisms exist in this classification. Such devices reflect color based upon the periodicity of a repeated structure. Structural color, in nature, can exhibit a broad color space and is often of striking color saturation.

One particular structural mechanism that was initially described by Lord Rayleigh in 1917 (see S. Kinoshita, "Structural Colors in the Realm of Nature", 2008) is that of the photonic crystal. Arsenault (Nature Photonics, 1, pg 468, 2007) describes an approach that builds a Bragg reflector using three dimensional photonic crystals wherein the crystal and, consequently, the Bragg refraction grating giving color, can be changed by changing the three dimensional geometry of the spherical photonic crystal elements. Photonic crystals are materials with a periodic modulation in refractive index. The characteristics of the crystals or Bragg reflector can be tuned to only reflect a narrow range of wavelengths (colors) due to constructive and destructive interference of the impinging light waves.

Structural color displays are rare (if extant at all) and no existing commercial device is addressable with either a slow or fast pixel transition.

Backlit color LCDs are very inefficient since, typically, less than 10% of the back light flux passes through the liquid crystal layer, even with all light valves fully opened. Existing reflective color displays provide poor color and refresh rates, although they may be energy efficient and use ambient white light.

What is needed is an improved reflective color display that is energy efficient, provides good color saturation, is capable of good resolution, enables a high refresh rate for displaying moving images, can be made thin, and can be manufactured inexpensively.

SUMMARY

A reflective color display is described employing a micro-LED array layer illuminating chromophore or structural color elements that can act as reflective light valves at either a slow or rapid pixel transition rate. Slow reflective light valves allow high contrast ratio e-paper metaphors while fast reflective light valves allow animated displays. In some instantiations, such displays can present to the end user vibrant colors that can display extra-trinary color, e.g., an extended color space that could allow at least some Pantone colors to be accurately represented on an electronic display. Furthermore, such a device can be built that can, like transflective displays, be equally efficacious with both indoor and outdoor light levels but provide superior image quality.

In one embodiment, a substrate is provided with addressable backplane conductors. The conductors may be metal areas under each pixel to be formed, where the metal areas are addressed using addressable row (X or horizontal) lines.

Vibration-absorbing and isolating pixel wells are formed over the substrate by screen printing, or by using another printing process. Printing can be accurate down to a few microns. The pixel wells may comprise four walls per pixel, forming a cube with an open top. The pixel walls may be non-rigid to dampen vibrations so that vibrations in one pixel well are not transmitted to an adjacent pixel well. Any size pixel array may be formed, including very large arrays.

Within each pixel well is printed the following thin layers.

A piezoelectric crystal (PZT) layer is printed over the backplane conductor and expands and contracts in response to an electric field.

An addressable transparent conductor layer is formed over the PZT layer. Addressable metal conductors in the Y direction contact the transparent conductor layer over the PZT layer in each pixel well. Therefore, each pixel well has an addressable pair of conductors (one conductor above and one conductor below its associated PZT layer) to create a controllable electric field across the PZT layer in each pixel well. Information signals are applied to the XY conductors to generate an electric field of a desired magnitude across the PZT layer within any selected pixel well to expand or contract the associated PZT layer within the well. Applying controlled electric fields to piezoelectric elements is known for generating precise physical movements such as vibrations.

Over the transparent conductor layer is printed an acoustic membrane that easily moves in the Z direction along with the PZT layer but absorbs high frequency vibrations. The acoustic membrane layer acts as an acoustic low pass filter. This is to allow the PZT layer to be controlled using a modulated high frequency AC signal rather than a DC signal. The magnitude or frequency of the AC signal is selected to control the Z dimension of the PZT layer in each pixel well. Only a fraction of a percentage change in the thickness of the PZT layer will cause a different wavelength to be reflected by the pixel.

Over the acoustic membrane is printed a photonic crystal. The photonic crystal may form a Bragg reflector having multiple thin layers with different indices of refraction, where the indices and the thicknesses of the layers (on the order of the wavelength of light to be reflected) determine the wavelength of impinging light that is reflected by the Bragg reflector. The selective reflection is due to the constructive and destructive interference of the impinging light waves reflecting off the layers. The tuning of the Bragg reflector for each color to be reflected is based on light impinging normal to the Bragg reflector. Light rays of the target wavelength impinging at a non-normal angle to the Bragg reflector may still be reflected but are significantly attenuated.

Over the photonic crystal layer is printed a thin but rigid transparent dielectric lid (also referred to as a standoff) having an index of refraction as close to one as practical to minimize internal reflection. The lid serves as a rigid barrier to compress the photonic crystal layer when the PZT layer in the pixel well is controlled to expand to cause the photonic crystal layer to reflect the target color. The compression of the photonic crystal layer need only be a few nanometers to change its reflected wavelength.

A very thin light emitting diode (LED) layer is then printed over the standoff to generate a white light containing all the wavelengths of interest. It is important that most of the impinging light into each pixel is substantially normal to the photonic crystal layer so that the photonic crystal layer reflects a large percentage of the target wavelength generated by the white light source. This is achieved by the extremely thin LED layer disclosed. To form the thin LED layer, the following process is used in one embodiment.

A first transparent conductor layer is printed over the standoff to act as an anode or cathode of the LEDs. Thin metal busses may also be printed below or above the transparent conductor layer to lower the effective electrical resistance of the transparent conductor layer.

A monolayer of microscopic LED particles is then printed over the first transparent conductor layer so that a "bottom" electrode of each LED electrically contacts the transparent conductor layer. Many thousands or even millions of the LED particles may be printed in a solvent (forming an LED ink) to generally uniformly cover the pixel array. Therefore, one or more LEDs will be directly overlying each of the pixel wells. The LEDs are printed and designed so that their light emitting surface faces the photonic crystal layer. The solvent is then evaporated by heating.

In one embodiment, the LEDs are GaN based and emit blue light. In one embodiment to create white light, the LEDs are each coated with a phosphor layer (e.g., a YAG phosphor) or a quantum dot layer that adds red and green components. In another embodiment to create white light, a phosphor layer (or a quantum dot layer) is printed between the transparent conductor layer and the standoff, and the thickness and density of the phosphor/quantum dot layer allows most of the reflected light to pass. In another embodiment, the wavelength conversion material is patterned to have openings for allowing the optimum amount of LED light and reflected light to pass through. The wavelength conversion layer is designed to most efficiently wavelength-convert at the LED emission wavelength.

A thin dielectric layer is then printed over the LEDs to insulate the first transparent conductor layer. The dielectric layer may wet off the "top" electrodes of the LED particles. If necessary, the "top" electrodes of the LED particles are exposed such as by a wet etch of the dielectric layer.

A second transparent conductor layer is then printed over the LEDs to contact the other of the LED electrodes. In one embodiment, all the LEDs are connected in parallel. In another embodiment, the conductor layers are segmented and interconnected so that the LEDs are connected in series and parallel.

The LED layer can be made less than 1 mm thick. Such a thin LED layer, and the high density of LED particles, enables the light impinging on each pixel to be substantially normal to the photonic crystal layer.

The LEDs may be driven by a DC or AC source (depending on the orientations of the LEDs) to produce a substantially uniform, downward facing, white light. Scattering particles in the LED layer may be used. The LEDs may be driven at about 3.5 volts.

The photonic crystal layer can now be controlled to reflect a narrow band of wavelengths, such as red, orange, yellow, green, blue, etc. within the LED emission depending on the compression of the photonic crystal layer (the Bragg reflector) by the PZT layer. The expansion and contraction of the PZT layer is controllable by the magnitude of the electric field within the pixel well, determined by the voltages applied to the X and Y conductors, and such expansion and contraction controls the thickness of the layers in the Bragg reflector. The thickness of the layers determines the narrow band of wavelengths that will be reflected. The resulting electric field may cause the photonic crystal layer to reflect no light or only invisible light (e.g., IR), so as to appear to be a black pixel, or reflect any wavelength of visible light.

The acoustic membrane, pixel walls, and substrate may be black. By the perceived merging of different colors generated by adjacent pixels (e.g., red, green, blue, and any other colors), any color (including white light) can be generated by the display. The color gamut is greater than an LCD that only typically generates red, green, and blue pixel colors.

The expansion/contraction of the PZT layer may be controlled by a frequency modulated sine wave or an amplitude modulated sine wave. If a frequency modulated sine wave is used, there will be more compression of the photonic crystal layer with lower modulating frequencies due to the filtering properties of the acoustic membrane. If an amplitude modulating sine wave is used, all AC may be filtered out by the acoustic membrane, and the compression is directly determined by the magnitude. AC modulating the PZT layer reduces the charging of parasitic capacitors and provides other benefits. The isolating pixel wells prevent the expansion/contraction of the PZT elements in one pixel well from affecting the PZT elements in an adjacent well to minimize cross-talk.

Due to the difficulty in achieving the exact same wavelength reflection in each pixel well for the same control signals on the XY conductors, each pixel may be tested using various programmed test signals, and a control signal correction factor for each pixel is stored in a memory. The stored correction factor for each pixel is applied to the incoming control signals for that pixel so that each pixel will reflect the same wavelength for the same externally generated control signals. For a very precise fabrication process, all pixels may be formed identically, and all pixels may use the same set of correction factors, if required.

The PZT layer may be adequately controlled using less than 2 volts and very little current. The LED source may be energized with about 3.5 volts.

All the layers described may be formed by printing using a fine mesh screen with a mask pattern formed by photolithographic techniques. The particles in each layer are in a solution when printed, and the solution is evaporated away using heat to leave the particles. The display may be formed under atmospheric pressures. Many other ways to form the display, other than by printing, are envisioned. The resulting color display, including the LED layer, may be less than a few millimeters thick.

If there is a suitable ambient light source (e.g., the sun), the color display may be used without energizing the LED display.

Other embodiments are disclosed.

BRIEF DESCRIPTION OF THE DRAWINGS

Elements that are the same or equivalent are labeled with the same numeral.

DETAILED DESCRIPTION

The color display will be referred to as a "μLED Display" or μD. For simplicity sake, only one instantiation of the device will be described in detail; however, those skilled in the art will understand that this method and device may apply to any addressable or non-addressable (e.g., static) reflective display device. In this case, a photonic crystal μD is described, as this implementation is both the most complicated and most complete example of the μD.

The disclosed Bragg reflector/photonic crystal display is both addressable and fast in terms of pixel change.

Figure 1:
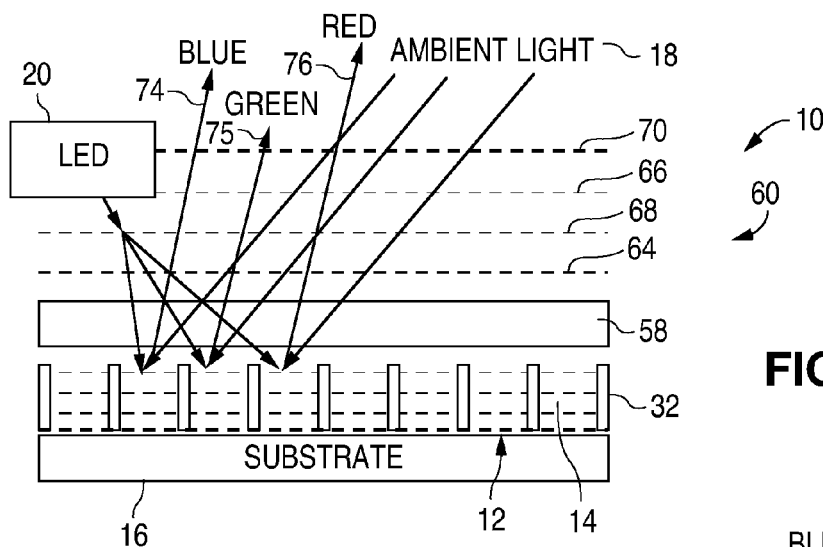
FIG. 1 is a simplified cross-sectional view of a portion of the color display across eight pixels, illustrating the controllable reflection of wavelengths by each pixel of the impinging white light from either an LED layer or an ambient light source, where three pixels are shown reflecting blue, green, and red light components, respectively.

FIG. 1 illustrates a general cross-sectional view of the display 10. The display 10 may be any size and have any number of pixels. For example, the display may be 2 cm across to 10 m across.

Figure 5:
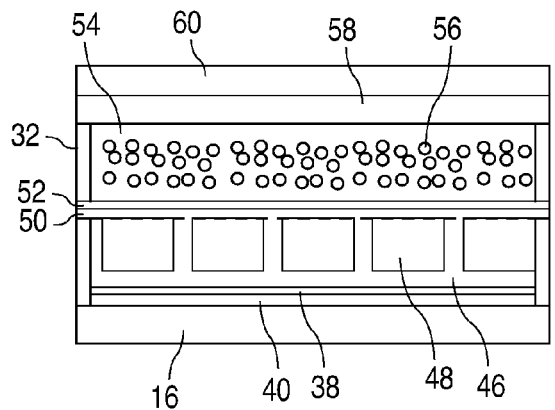
FIG. 5 is a cross-sectional view across a single pixel in the Y direction. A plurality of piezoelectric crystals is shown, but only a single PZT element is needed per pixel. Typically, due to the printing process, many microscopic crystals will be printed within each well.
Figure 6:
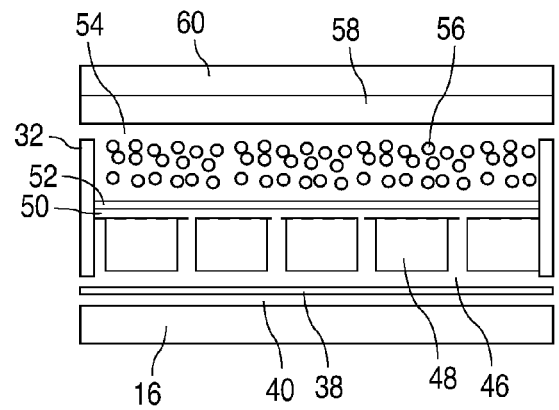
FIG. 6 is a cross-sectional view across the pixel of FIG. 5 but in the X direction.
Figure 7:
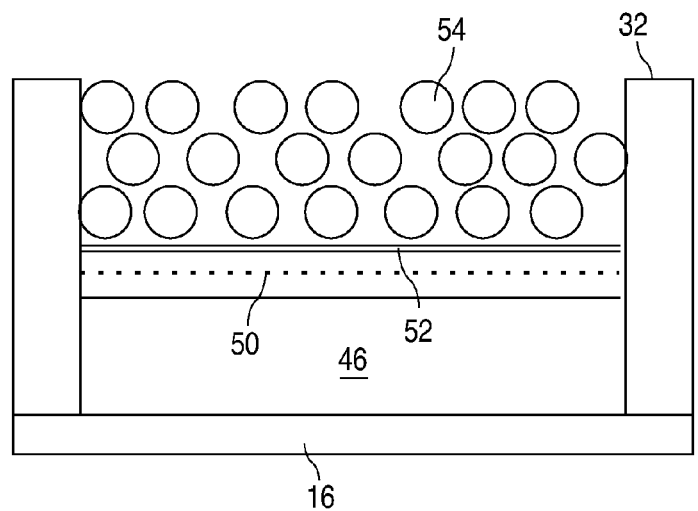
FIG. 7 is a close up, simplified view of a portion of a single pixel, where the PZT element is shown as a single element.

The display 10 has a layered structure, described in more detail with respect to FIGS. 5-7. The display 10 has an array of pixel wells 12, each containing a plurality of layers 14, formed over a substrate 16. The layers 14 include a photonic crystal layer and an underlying piezoelectric crystal (PZT) layer. Generally, the display 10 operates as an array of controllable Bragg reflectors (the photonic crystal layer) with the addressable piezoelectric crystals in each pixel well deforming the photonic crystal geometry and, thus, changing the wavelength of light that the Bragg reflector reflects. In one example, PZT refers to a specific type of inorganic piezoelectric material. However, other piezoelectric materials, either of an inorganic or organic nature, are available and may be substituted for PZT.

Details regarding forming a layer of piezoelectric materials and applying electric fields to expand and contract the piezoelectric materials are unnecessary herein due to the well known uses of such materials. Similarly, Bragg reflectors tuned to reflect a target wavelength are also very common, and details about such reflectors are not necessary to describe herein.

Input light to the Bragg reflector comes from either of two sources. The first is simply ambient polychromatic light 18, such as from the sun or a lamp. The second is from a generally orthogonal array of μLEDs 20 that are printed downward facing. These LEDs 20 may be blue emitters directly coated with a phosphor mixture (such as YAG) that Stokes shifts the blue 450 nm light generated by the LEDs into a near approximation of polychromatic light (white light).

In one embodiment, the mechanical piezoelectric force generated by the PZT is frequency modulated by a sine wave input, where a lower modulating frequency causes a greater compression of the photonic crystal layer. This transduced force adjusts the geometry of the photonic crystal layer and, thus, adjusts the Bragg reflectivity. Thus, both RGB and CMY color elements can be generated. It is also possible to drive the Bragg into IR thus yielding a transparent mode. If a black acoustic membrane (separating the Bragg reflector from the PZT layer) along with the black pixel walls 32 is used, then both a black contrast model akin to the Sony Trinitron is achieved along with a black (K) for the CMY.

Figure 2:
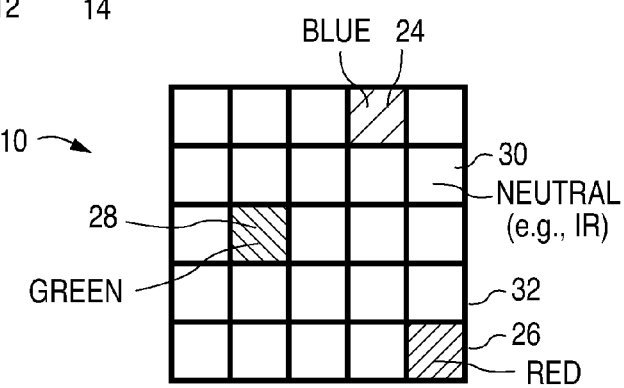
FIG. 2 is a top down view of a 5×5 pixel display (or a portion of a much larger display) illustrating that three pixels are being addressed and controlled to reflect blue, green, and red components of an impinging white light, while the remaining pixels are controlled to reflect no visible light so as to appear black.

FIG. 2 is a top down view of a section of the display 10. All the layers above the Bragg reflector are transparent. FIG. 2 shows only three pixels being controlled to reflect a particular wavelength in the impinging light. The remaining pixels are black, where the photonic crystal layers in those pixel wells are at some neutral Bragg reflection state so as not to reflect visible light. In the example, pixel 24 is controlled to reflect blue light, pixel 26 is controlled to reflect red light, pixel 28 is controlled to reflect green light, and pixels 30 are controlled (or in a neutral state) to reflect no visible light.

The black (K) boundaries (pixel walls 32) of the pixels are important to allow for a completely black display. Each pixel needs to be as isolated as possible. Analogizing each pixel as a speaker, each pixel needs to vibrate in as much isolation as possible.

Figure 3:
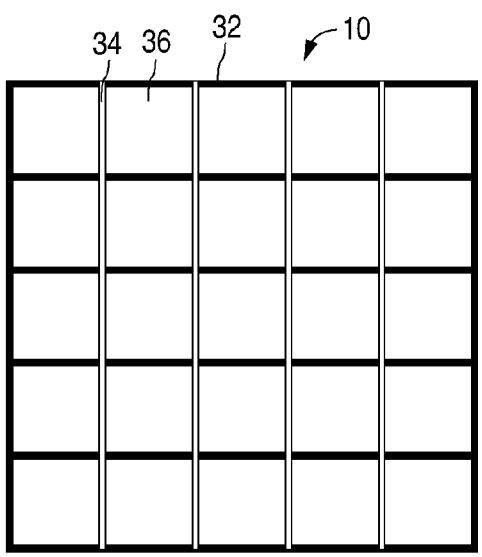
FIG. 3 is a top down view of the display at the Bragg reflector/acoustic membrane interface showing the addressable metal conductors in the Y direction (which are shown obscuring the pixel walls). The addressable metal conductors contact a transparent conductor layer over each pixel well.

FIG. 3 is a top down view of a section of the display 10 at the Bragg reflector/acoustic membrane junction. The pixel walls 32 are shown along with thin metal conductors 34 running along the walls 32 in the Y direction. The metal conductors 34 contact associated transparent conductor sections 36 within each pixel well to provide an electric potential to the transparent conductor sections 36 when that column of pixels is addressed.

Figure 4:
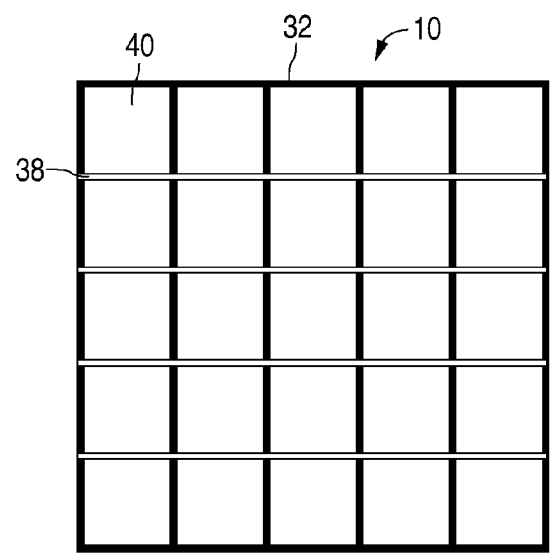
FIG. 4 is a top down view of the display at the PZT/backplane metal interface showing the addressable metal conductors in the X direction. The addressable metal conductors contact a conductor layer below each pixel well, so that an electric field of a selected magnitude may be placed across the PZT layer in any pixel well by applying energizing signals to a pair of the X and Y conductors.

FIG. 4 is a top down view of a section of the display 10 at the PZT/backplane junction. The backplane is the conductor pattern formed on the substrate 16 of FIG. 1. The pixel walls 32 are shown along with thin metal conductors 38 running along the walls 32 in the X direction. The metal conductors 38 contact associated conductor sections 40 at the bottom of each pixel well to provide an electric potential to the conductor sections 40 when that row of pixels is addressed.

When the intersection of a row and column is addressed by the metal conductors 34 and 38 by providing a potential difference across the pair of metal conductors, an electric field is supplied across the addressed PZT layer to expand or contract the PZT layer. This compresses or expands the photonic crystal layer above the PZT layer to cause it to reflect different wavelengths so as to display a certain color at that pixel.

FIGS. 5 and 6 illustrate cross-sections taken through a given pixel in Y and X directions, respectively. FIG. 7 is a simplified close up of a pixel well that better illustrates some of the layers. The metal conductor 38 is shown in FIG. 6

(along the X direction) extending under the pixel walls 32 since it is a row conductor. Applying a voltage to a row conductor causes a potential to appear at the bottom of each pixel well in that row. That same metal conductor 38 is shown in FIG. 5, but cut along the Y direction. Note that the conductor 38 is confined to the pixel well boundaries along the Y direction since the conductor 38 only extends along a row and not a column of pixels.

Above the conductor 38 is a PZT layer 46 formed of closely packed piezoelectric crystals particles 48 deposited by screen printing. Only five PZT particles 48 are shown for simplicity. The particles 48 expand and contract upon an electric field being applied across them. Only a fraction of a percent change in the thickness of the PZT layer 46 along the Z direction is needed to change the wavelengths reflected by the pixel.

Above the PZT layer 46 is a transparent conductor layer 50 connected to the metal conductors 34 (FIG. 3) along the columns of pixels. Note in FIG. 5 how the transparent conductor layer 50 extends along an entire column of pixels in the Y (column) direction, so the pixels walls 32 need to have an opening for the metal conductors 34 (FIG. 3) and transparent conductor layer 50 in the Y direction. In FIG. 6 (cut across the X direction), the transparent conductor layer 50 is shown being bounded by the pixel walls 32 since each column of the transparent conductor layer 50 is isolated from the other columns. The transparent conductor layer 50 is very thin and flexible. In an alternative embodiment, the conductor layer 50 need not be transparent if it is sufficiently flexible, since all light may be blocked by a black acoustic membrane layer 52, described below.

Above the transparent conductor layer 50 is the acoustic membrane layer 52. All layers may be screen printed and cured (e.g., heated) to remove the solvent and bind the particles together, if appropriate. The acoustic membrane layer 52 is an elastic layer that absorbs high acoustic frequencies by the PZT layer 46 so that the PZT layer 46 can be driven with a high frequency AC signal rather than a DC signal. The acoustic membrane layer 52 acts as a low pass filter to only transmit the low frequency or DC acoustical components of the PZT layer 46 to the overlying photonic crystal layer. This allows an FM signal modulated by a low frequency to compress the Bragg reflector more than an FM signal modulated with a higher frequency. Only about 2 volts is needed to adequately control the PZT layer 46.

Note in FIGS. 5 and 6 the differences in the pixel walls 32 and the transparent conductor/acoustic membrane layers 50 and 52 in the X and Y directions. These differences allow for the cross-point addressing of the pixels but retain the black (K) color of the pixel walls 32 and membrane 52 and provide the acoustical isolation required for the discrete deformation of the photonic crystal layer 46 in each individual pixel well.

Above the acoustic membrane 52 is printed a photonic crystal layer, referred to as a Bragg reflector 54. Very thin dielectric layers (on the order of the wavelength of visible light) of different indices of refraction are deposited by printing to form the Bragg reflector 54. The various layers may be designed to not reflect any visible light in their relaxed state. Very thin layers may be printed by dispersing dielectric particles 56 in a solvent and printing the solution. When the solvent is evaporated, a thin layer of the dielectric particles 56 remains. The particles 56 can be made any size, such as nanoparticles. Thin layers of particles 56 of different indices of refraction are printed, one on top of another. Only three layers are shown, but the Bragg reflector 54 may be formed of many more layers. The construction of Bragg reflectors is well known. When the Bragg reflector 54 is compressed by application of an electric field to the underlying PZT layer 46, the physical characteristics the Bragg reflector 54 change to reflect different visible wavelengths. The particles 56 in each layer of the Bragg reflector 54 should be compressible. By correlating the control signals to the wavelengths reflected, a set of control signals may be supplied to cause any pixel to reflect any predetermined visible color. The combinations of the colors from proximate pixels, or the rapid time multiplexed control of the same pixel to reflect different wavelengths, can be used to create any color to the human eye.

Above the Bragg reflector 54 is a rigid printed dielectric standoff 58 (a lid), which provides a relatively rigid backing for the Bragg reflector 54 to enable the reflector layers to be compressed. The standoff 58 is transparent and has an index of refraction that minimizes internal reflection. In one embodiment, the index of refraction is as close to one as practical.

Above the standoff 58 is deposited a white light source 60 comprising many thousands of microscopic LED particles. FIG. 1 illustrates the construction of the white light source 60. Further detail of forming a suitable white light source 60 by printing can be found in US application publication US 20120164796, entitled, Method of Manufacturing a Printable Composition of Liquid or Gel Suspension of Diodes now U.S. Pat. No. 8,852,467, assigned to the present assignee and incorporated herein by reference. In that publication, an LED wafer is photolithographically patterned, by masking and etching, to form a trench around each LED in the wafer. The backside of the wafer is then ground/polished until the microscopic LEDs are singulated.

With reference to FIG. 1, a bottom transparent conductor layer 64 is deposited to provide, for example, an anode conductor.

A solution containing microscopic LED particles 66 (emitting blue light) coated with a layer of YAG phosphor (or quantum dots) is then printed over the transparent conductor layer 64. The LEDs emit blue light and the YAG phosphor adds a yellow-green component to produce white light. Red phosphor may be added to increase the red component of the white light. Such phosphor may be printed as a layer over the LED wafer prior to singulation, so that each LED has the same phosphor over it after singulation. In the case of quantum dots as the wavelength-conversion material, quantum dots generating green and red light may be used, and the quantum dots are coated over the LED wafer using known methods. Quantum dots have the potential of being much more efficient than phosphor.

A single enlarged LED 20 is shown emitting light of a peak wavelength (e.g., blue or UV) that is wavelength-converted to white light by a wavelength-conversion layer 68.

Instead of coating the LED particles with a phosphor or quantum dots to create white light, a phosphor layer (or quantum dot layer) may be printed between the LEDs and the standoff 58. The wavelength-conversion layer 68 is designed to allow some of the blue LED light to pass through and allow the reflected light to pass through. The wavelength-conversion layer 68 is substantially only excited by the original LED light, so the reflected light does not substantially get converted.

In one embodiment, the LED generates UV or other wavelength shorter than the blue pixel color, and the phosphor/quantum dot layer converts the light to contain at least the blue, green, and red pixel colors. Optimal efficiency is obtained by the wavelength-conversion material generating a narrow bandwidth centered around each primary pixel color, or around the green and red pixel colors in the case of a blue LED. The phosphor/quantum dot layer is designed to not be "excited" at wavelengths other than the LED emission. Therefore, the reflected light does not energize the phosphor/quantum dot layer, whether the layer is a separate layer or a coating over the LEDs.

In one embodiment, the phosphor/quantum dot layer is patterned to have transparent spaces for the optimum light leakage.

The LED particles are designed to orient themselves with their anode electrode and light emitting surface facing the Bragg reflector (located below the standoff 58). US patent application publication 2012/0164796, assigned to the present assignee, describes a suitable process for printing the LED particles. That publication is incorporated herein by reference. The LED anodes electrically contact the transparent conductor layer 64. Thin metal buses may be printed on or under the transparent conductor layer 64 to lower resistance.

A dielectric layer is then printed over the transparent conductor layer 64, while exposing the cathode electrodes of the LED particles.

A top transparent conductor layer 70 is then printed to contact the LED's cathode electrodes. The LED particles are thus connected in parallel. The conductors may be printed in isolated sections to enable the LED particles to be connected in series and parallel, depending on the size of the display. A voltage of about 3.5 volts may be used to energize the LEDs connected in parallel to create white light.

Spaces between the LED particles allow the reflected light to pass through the white light source 60 with little attenuation.

Since the white light source 60 can be made less than 1 mm thick and there may be many LED particles over each pixel well, the light impinging on the Bragg reflector 54 in each pixel well will be generally normal to the surface of the Bragg reflector 54 to maximize the efficiency of the display, since the characteristics of the Bragg reflectors are controlled to reflect a target wavelength with the assumption that light is impinging at a normal angle to the Bragg reflector.

Any wavelength within the white light source 60 can be reflected by the Bragg reflector 54 in each pixel well. If the Bragg reflector 54 is controlled to not reflect any visible light, the white light will be absorbed by the black acoustic membrane layer 52 and black pixel walls 32 so that the pixel will appear black. FIG. 1 illustrates a blue light ray 74 emitted from a first pixel, a green light ray 75 emitted from a second pixel, and a red light ray 76 emitted from a third pixel. Either the white light source 60 or the ambient light 18, or both, are used as the light source.

All deposited layers may be formed by printing. Each layer may be a fraction of a millimeter, allowing the entire display 10 to be less than 3 mm thick.

As printing technology progresses and materials are optimized, the resolutions of the display 10 can be improved. A present advantage of the display 10 described is that it can be made very large and inexpensively, and it can be controlled using very little power. Ambient light may be used as the white light source in addition to the LED light source to improve efficiency and improve the brightness for an outdoor display.

The pixels may be controlled by addressing the row and column conductors to create a dynamic display (to display motion) or a static display, such as a sign.

Due to the inherent nature of the display design, it is difficult to perfectly duplicate the reflective characteristics for each pixel from pixel to pixel and from display to display. Accordingly, a correction factor for each pixel may be derived by testing the display, and the correction factors are stored in a memory and applied to the incoming control signals for each pixel. A simple decoder may convert an externally generated standard set of control signals into the customized control signals for a particular display. If all the pixels are identical then a single correction factor may be needed for the entire display or no correction factor is needed.

Many other embodiments are envisioned using the general principals described herein.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A reflective color display comprising:
 a substrate;
 a first conductor layer supported by the substrate;
 an array of pixel wells formed overlying the first conductive layer;
 a piezoelectric layer formed overlying the first conductor layer, the piezoelectric layer being segmented such that there is a piezoelectric segment in each pixel well;
 a second conductor layer overlying the piezoelectric layer, wherein an electric field created across any piezoelectric segment causes the piezoelectric segment to expand or contract under control of the electric field;
 a photonic crystal layer overlying the piezoelectric layer, the photonic crystal layer being segmented such that there is a photonic crystal segment overlying each piezoelectric segment in each pixel well; and
 a light source layer overlying the photonic crystal layer, the light source layer generating a multi-wavelength light emission impinging on each photonic crystal segment, wherein varying the electric field across each piezoelectric segment causes the photonic crystal segment above the associated piezoelectric segment to reflect a selected wavelength, whereby each pixel well can be controlled to reflect a selected color within the multi-wavelength light emission.

2. The display of claim 1 wherein walls of the pixel wells provide acoustic isolation between adjacent pixel wells.

3. The display of claim 1 further comprising an acoustic membrane between each piezoelectric segment and its associated photonic crystal segment for isolating the photonic crystal segment from high frequency vibrations of the piezoelectric segment.

4. The display of claim 1 wherein the photonic crystal segment is a Bragg reflector segment.

5. The display of claim 1 wherein the light source is a layer of light emitting diodes.

6. The display of claim 1 further comprising a standoff layer overlying the photonic crystal layer for substantially blocking movement of the photonic crystal layer, allowing an expansion of the piezoelectric segment to compress its overlying photonic crystal layer to reflect the selected color.

7. The display of claim 1 wherein the light source comprises an array of light emitting diodes (LEDs), distributed across a surface of the display, emitting light in the direction of the photonic crystal layer, wherein reflected light from the photonic crystal layer passes through spaces between the LEDs.

8. The display of claim 1 wherein each pixel well is controllable by the electric field to selectively reflect any of red light, green light, and blue light.

9. The display of claim 1 wherein each pixel well is controllable by the electric field to selectively reflect any of red light, green light, blue light, and no visible light.

10. The display of claim 1 wherein the pixel wells are black.

11. The display of claim 1 further comprising a black layer underlying the photonic crystal layer to absorb light passing through the photonic crystal layer.

12. The display of claim 1 wherein at least the piezoelectric layer and the photonic crystal layer are printed layers.

13. The display of claim 12 wherein the light source layer is also a printed layer.

14. The display of claim 1 wherein the light source layer comprises a layer of light emitting diodes (LEDs) that emit light having a peak wavelength of blue or shorter, wherein the LEDs have a wavelength-conversion layer that creates the multi-wavelength light emission.

15. The display of claim 1 wherein the light source layer comprises:
a layer of light emitting diodes (LEDs) that emit light having a peak wavelength of blue or shorter; and
a separate wavelength-conversion layer, between the LEDs and the photonic crystal layer, that creates the multi-wavelength light emission.

16. The display of claim 1 wherein the light source layer comprises a combination of a layer of light emitting diodes (LEDs), generating light having a peak wavelength, and a wavelength-conversion material for generating the multi-wavelength light emission.

17. The display of claim 16 wherein the wavelength-conversion material comprises at least one of phosphor and quantum dots.

18. A method performed by a color reflective display comprising:
receiving a multi-wavelength light emission from a light source;
controlling an electric field across a piezoelectric layer segment, wherein a piezoelectric layer is divided into an array of piezoelectric layer segments, with each piezoelectric layer segment being in an associated pixel well;
compressing and expanding the piezoelectric layer segment pursuant to the electric field; and
selectively reflecting color components of the multi-wavelength light emission by a photonic crystal layer segment overlying the piezoelectric layer segment, wherein a photonic crystal layer is divided into an array of photonic crystal layer segments, with each photonic crystal layer segment being in an associated pixel well, the compressing and expanding of the piezoelectric layer segment causing the photonic crystal layer segment to compress and expand to adjust a wavelength reflection characteristic of the photonic crystal layer segment.

19. The method of claim 18 wherein each pixel well is controllable by the electric field to selectively reflect any of red light, green light, blue light, and no visible light.

20. The method of claim 18 wherein the light source comprises an array of light emitting diodes (LEDs), distributed across a surface of the display, the method further comprising:
energizing the LEDs to cause the LEDs to emit light in the direction of the photonic crystal layer, wherein reflected light from the photonic crystal layer segment passes through spaces between the LEDs.

21. The method of claim 18 further comprising, by arranging an acoustic membrane between each piezoelectric layer segment and its associated photonic crystal layer segment, isolating the photonic crystal layer segment from high frequency vibrations of the piezoelectric layer segment.

22. The method of claim 18 wherein the photonic crystal layer segment is a Bragg reflector segment.

23. The method of claim 18 further comprising absorbing light that passes through the photonic crystal layer segment by a black layer underlying the photonic crystal layer segment.

24. The method of claim 18 further comprising controlling electric fields across respective piezoelectric layer segments, in the array of piezoelectric layer segments, to create different color pixels across the display by selective compression and expansion of associated photonic crystal layer segments overlying the piezoelectric layer segments.

25. The method of claim 18 wherein the light source comprises a combination of a layer of light emitting diodes (LEDs), generating light having a peak wavelength, and a wavelength-conversion material for generating the multi-wavelength light emission, wherein the light source is deposited overlying the photonic crystal layer.

* * * * *